(12) United States Patent
Nakata

(10) Patent No.: US 6,633,179 B1
(45) Date of Patent: Oct. 14, 2003

(54) BIDIRECTIONAL SIGNAL CONTROL CIRCUIT

(75) Inventor: Mitsunori Nakata, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 415 days.

(21) Appl. No.: 09/638,919

(22) Filed: Aug. 16, 2000

(30) Foreign Application Priority Data

Sep. 29, 1999 (JP) ............................................ 11-275507

(51) Int. Cl.[7] .............................................. H03K 19/173
(52) U.S. Cl. ............................... 326/38; 326/41; 326/82
(58) Field of Search ............................... 326/37–41, 82, 326/56–58

(56) References Cited

U.S. PATENT DOCUMENTS

| 5,517,135 | A | * | 5/1996 | Young ........................... 326/86 |
| 5,627,480 | A | * | 5/1997 | Young et al. .................. 326/17 |
| 5,847,580 | A | * | 12/1998 | Bapat et al. .................... 326/82 |
| 6,246,259 | B1 | * | 6/2001 | Zaliznyak et al. ............. 326/41 |

* cited by examiner

*Primary Examiner*—Don Le
(74) *Attorney, Agent, or Firm*—Rabin & Berdo, P.C.

(57) ABSTRACT

A wire used for transferring bidirectional signals is divided into a plurality of sub line segments. These sub line segments are classified into groups. Further, bidirectional buffers are provided between respective adjacent sub wires. The direction of transfer of a signal by each of the bidirectional buffers is controlled based on at least one of control signals used to control drivers for respectively outputting data signals to the sub line segments.

12 Claims, 2 Drawing Sheets

BIDIRECTIONAL SIGNAL CONTROL CIRCUIT

BACKGROUND OF THE INVENTION

1. Field of the Invention

The present invention relates to a bidirectional signal control circuit, and particularly to a bidirectional signal control circuit for controlling the transfer of data signals outputted from a plurality of tri state drivers through a wire used for bidirectional signals.

2. Description of the Related Art

Upon the design of an LSI, a plurality of functional blocks are placed over one chip and an interconnection or wire is used to connect between the functional blocks. It is common that designed blocks registered in a library are placed and a wire for transferring unidirectional or bidirectional signals is used to connect between the blocks. Such a semiconductor integrated circuit needs a high-speed operation. Therefore, it is also necessary to contrive the wire.

FIG. 2 is a diagram showing connections for transferring bidirectional signals, which are employed in a conventional semiconductor integrated circuit.

In FIG. 2, reference numeral 10 indicates an interconnection or wire for transferring bidirectional signals, which is employed in the semiconductor integrated circuit. Reference numerals 11, 12, 13, 14 and 15 respectively indicate tri state drivers placed at output lines for outputting signals to the wire 10.

The tri state drivers 11 through 15 are CMOS tri state drivers respectively. Each of the tri state drivers 11 through 15 has three output states: a normal 1 level (voltage level being a source voltage level), a normal 0 level (voltage level being a ground voltage level) and a high impedance state produced by electrically cutting off an output. Reference numerals 11a through 15a indicate control signals for controlling the tri state drivers 11 through 15, respectively.

When the semiconductor integrated circuit is a logic LSI, for example, the output lines electrically connected to the wire 10 used as a signal line via the tri state drivers 11 through 15 are called "bus lines". Further, each of them is used so as to control the other gate to [high impedance] when logic of [0] or [1] is outputted to one gate. Since the logic LSI can be simplified in configuration when the tri state drivers 11 through 15 are used with respect to the output lines connected to the wire 10, it has been widely used.

However, with recent advances in scale down of a semiconductor integrated circuit, a delay due to load capacity and resistance, which results from a wiring length, becomes predominant. This RC wiring delay rapidly increases as compared with a gate delay. Thus, the transfer of bidirectional signals under the configuration shown in FIG. 2 has created difficulties in activating the semiconductor integrated circuit at high speed. Therefore, a block-to-block connection has been used in which buffers are interposed at midpoint in a wire as shown in FIG. 3.

FIG. 3 is a diagram showing an example illustrative of connections between bidirectional signals in an improved semiconductor integrated circuit. The same elements of structure as those shown in FIG. 2 are identified by the same reference numerals.

Referring to FIG. 3, reference numerals 21, 22, 23 and 24 respectively indicate bidirectional buffers placed in the course of an interconnection or wire used for the bidirectional signals. Reference numeral 30 indicates the wire used for the bidirectional signals. The wire 30 is divided into five wiring parts or sections 31, 32, 33, 34 and 35 by the bidirectional buffers 21 through 24 respectively.

Further, reference numerals 11, 12, 13, 14 and 15 respectively indicate tri state drivers respectively placed at output lines electrically connected to their corresponding wiring sections 31 through 35. Reference numerals 11a through 15a respectively indicate control signals for respectively controlling the directions of the tri state drivers 11 through 15 and the bidirectional buffers 21 through 24. Reference numerals 41 through 46 indicate OR gates for ORing the corresponding control signals 11a through 15a for the purpose of performing directional control and outputting the results of ORing to the bidirectional buffer 21 through 24 as control signals, respectively.

The bidirectional buffers 21 through 24 amplify the signals inputted thereto lying over the wiring sections 31 through 35 used for the bidirectional signals and supply the so-amplified signals to the adjacent wiring sections respectively. Incidentally, the bidirectional buffers might be called "repeaters" respectively. Further, tri state buffers might be called simply "buffers" respectively.

When, for example, a signal is outputted to the wire 30 from the tri state driver 12 in the above-described configuration, the control signal 12a to be outputted to the tri state driver 12 is supplied thereto. Therefore, the bidirectional buffer 21 outputs the signal from the wiring section 32 to the wiring section 31, the bidirectional buffer 22 outputs the signal from wiring section 32 to the wiring section 33, the bidirectional buffer 23 outputs the signal from the wiring section 33 to the wiring section 34, and the bidirectional buffer 24 outputs the signal from the wiring section 34 to the wiring section 35, respectively. The signal is transferred in this way.

In such a conventional bidirectional signal control circuit, however, the signal lines for respectively supplying the control signals to the bidirectional buffers 21 through 24 respectively reach about ⅘ of the length of the wire when they are the longest. Therefore, a delay of each output control signal on the signal line for supplying the output control signal could lead to a hindrance to speeding up even if the speeding up of the transfer of each signal to the wire would be implemented. Thus, a problem arises in that a further speeding-up is difficult.

An object of the present invention is to provide a bidirectional signal control circuit capable of reducing a delay of a control signal outputted from each of bidirectional buffers and achieving the speeding-up thereof in a simple configuration.

SUMMARY OF THE INVENTION

In order to solve the above problems, there is provided a bidirectional signal control circuit according to the present invention, which comprises a wire for transferring bidirectional signals, which is comprised of a plurality of sub line segments grouped into a first group including one or plural sub wires close to one another, a second group including the remaining sub line segments, and sub line segments placed between the first group and the second group; a plurality of drivers respectively connected to corresponding ones of the sub line segments and for respectively transferring data signals to the sub line segments in response to one of a plurality of control signals; and a plurality of bidirectional buffers respectively placed between the sub line segments. The bidirectional buffers connected to the sub line segments included in the first group are respectively controlled so as to transfer signals in the direction of the sub line segments placed between the first group and the second group when the data signals are respectively transferred to the sub line segments included in the fist group through the drivers. The bidirectional buffers connected to the sub line segments included in the second group are respectively controlled so as to transfer signals in the direction of the sub line segments placed between the first group and the second group when the data signals are respectively transferred to the sub line segments included in the second group through the drivers.

The object of the present invention is achieved by constructing the bidirectional signal control circuit in this way.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFFERED EMBODIMENTS

A preferred embodiment of the present invention will hereinafter be described with reference to the accompanying drawings.

Figure 1:
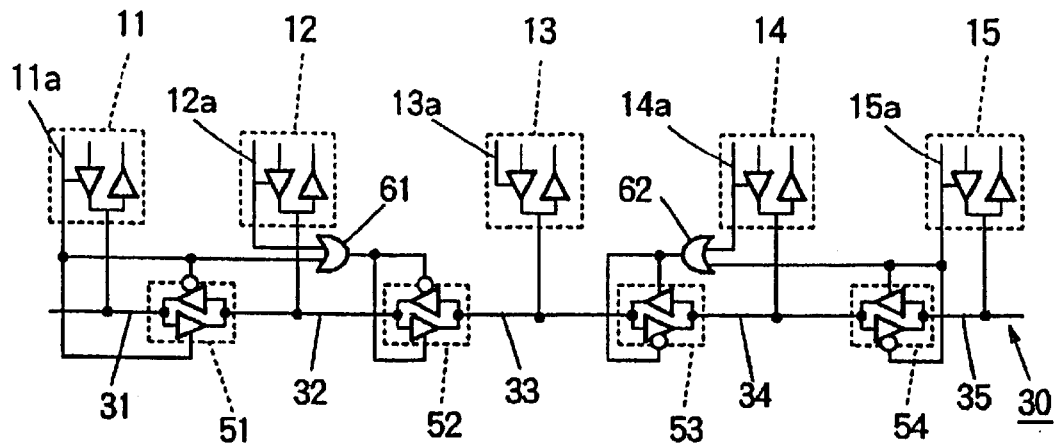
FIG. 1 is a circuit diagram showing a configuration of a bidirectional signal control circuit according to an embodiment of the present invention.
Figure 2:
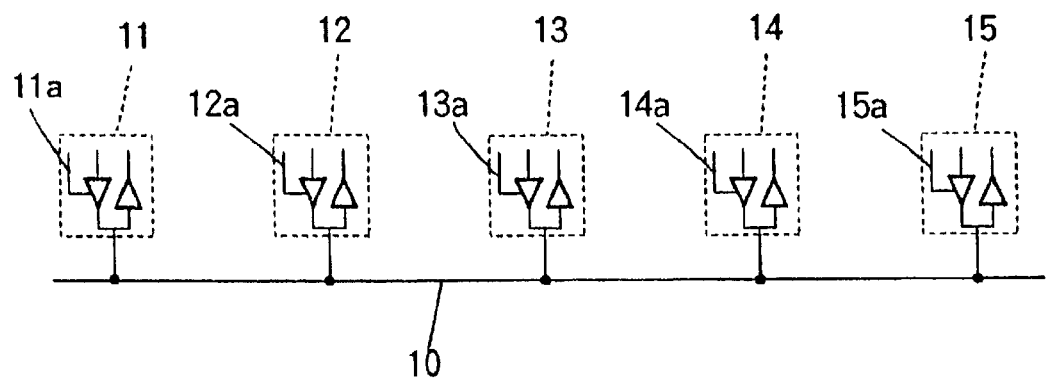
FIG. 2 is a diagram showing an example illustrative of connections for transferring bidirectional signals in a conventional semiconductor integrated circuit.
Figure 3:
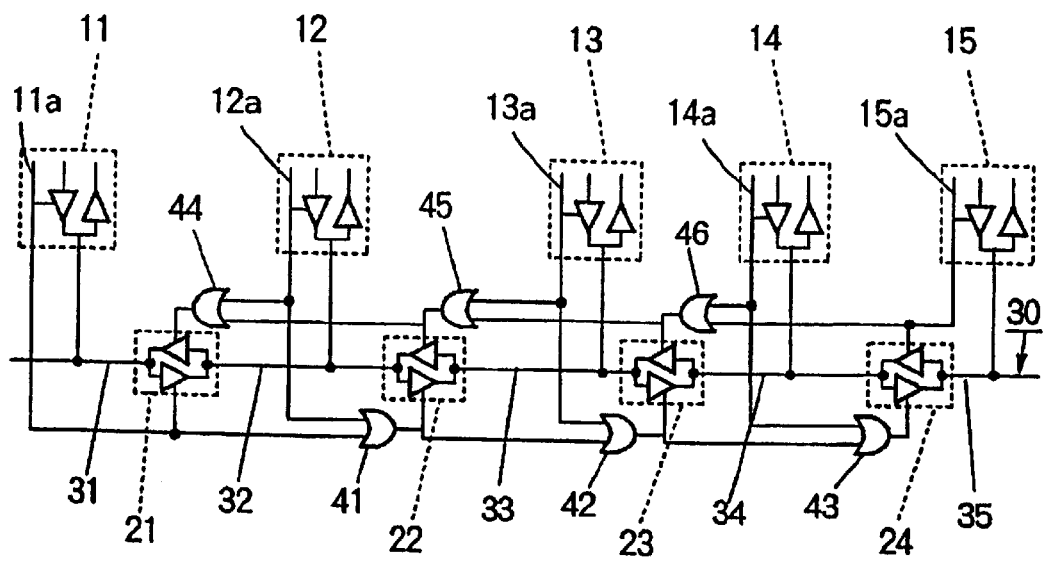
FIG. 3 is a circuit diagram illustrating a configuration of a bidirectional signal control circuit employed in a conventional improved semiconductor integrated circuit.

FIG. 1 is a circuit diagram showing a configuration of a two-way or bidirectional signal control circuit according to an embodiment of the present invention. Upon description of the present embodiment, the same elements of structure as those employed in the bidirectional signal control circuit shown in FIG. 3 are identified by the same reference numerals.

Referring to FIG. 1, reference numeral 30 indicates a wire or interconnection used for two-way or bidirectional signals. Reference numerals 51, 52, 53 and 54 indicate bidirectional buffers placed in the course of the wire 30 respectively. The wire 30 is divided into five wiring parts or sections 31, 32, 33, 34 and 35 by the bidirectional buffers 51 through 54.

Further, reference numerals 11, 12, 13, 14 and 15 indicate tri state drivers placed at output lines electrically connected to their corresponding wiring sections 31 through 35 respectively. Reference numerals 11a through 15a respectively indicate control signals for controlling the outputs of data signals from the tri state drivers 11 through 15 and the directions of the bidirectional buffers 51 through 54. Reference numeral 61 indicates an OR gate (logical sum circuit) for ORing the control signals 11a and 12a and outputting the result of ORing to the bidirectional buffer 52 for the purpose of performing buffer directional control. Reference numeral 62 indicates an OR gate for ORing the control signals 14a and 15a and outputting the result of ORing to the bidirectional buffer 53 for the purpose of performing buffer directional control.

The bidirectional buffers 51 through 54 amplify the signals inputted thereto lying over the wiring sections 31 through 35 used for the bidirectional signals and supply the so-amplified signals to the adjacent wiring sections respectively. The bidirectional buffers 51 through 54 respectively comprise pairs of anti-parallel connected buffer circuits. The respective buffer circuits are complementarily controlled based on the control signals 11a through 15a or control signals created based on them. Namely, one buffer circuit has an inverter to supply a control signal obtained by inverting a control signal supplied to one buffer circuit to the other buffer circuit. Incidentally, the inverter may be externally provided.

Connections of the bidirectional signals will be described as follows.

The control signal 11a used for the tri state driver 11 is complementarily supplied to each individual control terminals of the bidirectional buffer 51 as a control signal for the bidirectional buffer 51. Further, the control signal 11a is ORed with the control signal 12a for the tri state driver 12 by the OR gate 61, followed by complementarily supply to each individual control terminals of the bidirectional buffer 52 as a control signal for the bidirectional buffer 52.

On the other hand, the control signal 15a used for the tri state driver 15 is complementarily supplied to respective control terminals of the bidirectional buffer 54 as a control signal for the bidirectional buffer 54.

Further, the control signal 15a is ORed with the control signal 14a for the tri state driver 14 by the OR gate 62, followed by complementarily supply to respective control terminals of the bidirectional buffer 53 as a control signal for the bidirectional buffer 53.

In the circuit configuration wherein the wire 30 is divided into five by the bidirectional buffers 51 through 54 and the tri state drivers 11 through 15 are respectively electrically connected to the wiring sections 31 through 35 as described above, the bidirectional buffers 51 through 54 are directionally controlled according to the presence or absence of the outputs of the control signals for the tri state drivers 11 through 15 respectively connected to the wiring sections lying thereoutside (on the sides closer to the ends on the wire)(according to whether the voltage levels of the control signals are respectively a source voltage level (hereinafter called "high level") or a ground voltage level (hereinafter called "low level") or they are respectively active or inactive).

One, e.g., the wiring section 33 of the wiring sections, other than the first and second wiring sections 31 and 35 placed at both ends on the wire, of the plurality of wiring sections 31 through 35 will now be referred to as "third wiring section". The bidirectional buffer 51 connected to the end (i.e., the end closer to the center) of the first wiring section 31 on the third wiring section 33 side is controlled by the control signal 11a supplied to the tri state driver 11 electrically connected to the first wiring section 31. The bidirectional buffer 54 electrically connected to the end of the second wiring section 35 on the third wiring section 33 side is controlled by the control signal 15a supplied to the tri state driver 15 electrically connected to the second wiring section 35.

The bidirectional buffer 52 electrically connected to one end on the third wiring section 33 side, of the wiring section 32 placed between the first wiring section 31 and the third wiring section 33 is controlled by a control signal (corresponding to the output of the OR gate 61) obtained by ORing the control signal 12a supplied to the tri state driver 12 electrically connected to the wiring section 32 and the control signal 11a supplied to the bidirectional buffer 51 electrically connected to the other end of the wiring section 32 on the first wiring section 31 side.

The bidirectional buffer 53 electrically connected to one end on the third wiring section 33 side, of the wiring section 34 placed between the second wiring section 35 and the third wiring section 33 is controlled by a control signal (corresponding to the output of the OR gate 62) obtained by ORing the control signal 14a supplied to the tri state driver 14 electrically connected to the wiring section 34 and the control signal 15a supplied to the bidirectional buffer 54 electrically connected to the other end of the wiring section 34 on the second wiring section 35 side.

The operation of the bidirectional signal control circuit configured as described above will be described below.

When the respective control signals 11a through 15a are respectively high in voltage level, the tri state drivers 11 through 15 for outputting the data signals to their corresponding wiring sections are controlled so as to output the data signals respectively. When any of the control signals 11a through 15a is high in voltage level, others are all low in voltage level. When any of the tri state drivers outputs a data signal therefrom in response to its corresponding control signal, other tri state drivers are controlled so as not to output data signals therefrom.

When it is desired to output a signal through the tri state driver 11, the control signal 11a supplied to the tri state driver 11 is first outputted (the voltage level thereof is brought to a high level) therefrom. In response to the control signal 11a, the bidirectional buffer 51 buffers the signal and outputs it from the wiring section 31 to the wiring section 32 (this will hereinafter be called simply "output") Simultaneously, the bidirectional buffer 52 outputs a signal from the wiring section 32 to the wiring section 33 in response to the signal obtained by ORing the control signal 11a and the signal inputted thereto by the OR gate 61.

At this time, the control signals 14a and 15a for the tri state drivers 14 and 15 respectively electrically connected to the wiring sections 34 and 35 placed outside the bidirectional buffers 53 and 54 (on the second wiring section 35 side, i.e., the right side as viewed in FIG. 1) are not outputted from the bidirectional buffers 53 and 54 (their voltage levels are low). Therefore, the signals are respectively outputted from the wiring section 33 to the wiring section 34 and from the wiring section 34 to the wiring section 35. Namely, since the control signals 14a and 15a are not supplied, the buffer circuits of the bidirectional buffers 53 and 54, which are supplied with their corresponding inverted signals, are kept in their driven states. Thus, the signal outputted from the tri state driver 11 is sequentially outputted to the wiring section 35 lying in the direction of the end of the wire.

Next, when it is desired to output a data signal through the tri state driver 12, the control signal 12a is outputted. Since the control signal 11a supplied to the tri state driver 11 electrically connected to the wiring section 31 placed outside the bidirectional buffer 51 (on the first wiring section 31 side, i.e., the left side as viewed in FIG. 1) is not outputted, the bidirectional buffer 51 outputs a data signal from the wiring section 32 to the wiring section 31. On the other hand, the bidirectional buffer 52 outputs a data signal from the wiring section 32 to the wiring section 33 in response to a signal obtained by ORing the control signal 12a for the tri state buffer 12a and the signal inputted thereto by the OR gate 61. Further, the control signals 14a and 15a for the tri state drivers 14 and 15 respectively electrically connected to the wiring sections 34 and 35 placed outside the bidirectional buffers 53 and 54 (on the right side) are not outputted from the bidirectional buffers 53 and 54. Therefore, data signals are respectively outputted from the wiring section 33 to the wiring section 34 and from the wiring section 34 to the wiring section 35 in a manner similar to the above.

Next, when it is desired to output a data signal through the tri state driver 13, the control signal 13a is outputted. The control signals 11a, 12a, 14a and 15a respectively supplied to the tri state drivers 11, 12, 14 and 15 are not outputted therefrom. Therefore, the bidirectional buffers 51, 52, 53 and 54 respectively output data signals from the wiring section 32 to the wiring section 31, the wiring section 33 to the wiring section 32, the wiring section 33 to the wiring section 34 and the wiring section 34 to the wiring section 35.

Next, when it is desired to output a data signal through the tri state driver 14, the control signal 14a is outputted. Since no control signal 15a supplied to the tri state driver 15 is not outputted, the bidirectional buffer 54 outputs a data signal from the wiring section 34 to the wiring section 35. Simultaneously with its output, the bidirectional buffer 53 outputs a data signal from the wiring section 34 to the wiring section 33 in response to a signal obtained by ORing the control signal 14a supplied to the tri state driver 14 and the signal inputted thereto by the OR gate 62. Further, since the control signals 11a and 12a supplied to the tri state drivers 11 and 12 are not outputted, the bidirectional buffers 51 and 52 output data signals from the wiring section 32 to the wiring section 31 and the wiring section 33 to the wiring section 32 respectively.

Next, when it is desired to output a data signal through the tri state driver 15, the control signal 15a supplied to the tri state driver 15 is outputted. The bidirectional buffer 54 outputs a data signal from the wiring section 35 to the wiring section 34 in response to the control signal 15a. Simultaneously with its output, the bidirectional buffer 53 outputs a data signal from the wiring section 34 to the wiring section 33 in response to a signal obtained by ORing the control signal 15a and the signal inputted thereto by the OR gate 62. Since, at this time, the control signals 11a and 12a respectively supplied to the tri state drivers 11 and 12 are not outputted, the bidirectional buffers 51 and 52 output data signals from the wiring section 32 to the wiring section 31 and the wiring section 33 to the wiring section 32 respectively.

Thus, even if the data signals are outputted onto the wiring sections 31 through 35 through any of the tri state drivers 11 through 15, the bidirectional buffers 51 through 54 are directionally controlled so as to transfer the data signal outputted from the corresponding tri state driver to all the wiring sections.

According to the bidirectional signal control circuit according to the embodiment, as has been described above, the length of the wire used for the control signals for directionally controlling the bidirectional buffers 51 through 54 can be shortened. Thus, a further speeding-up can be achieved owing to the prevention of a delay of each control signal.

Namely, the present embodiment can reduce the length of the wire used for the control signals for controlling the bidirectional buffers 51 through 54 to about half the wire shown in FIG. 3 as is apparent as compared with FIG. 3. It is therefore possible to prevent a delay of each control signal due to a RC wiring delay and thereby achieve the speeding up of the entire circuit.

Further, the number of the OR gates 61 and 62 for supplying the control signals outputted from the tri state drivers 11 through 15 to their corresponding bidirectional buffers 51 through 54 can be greatly reduced (to ⅓) as compared with the conventional example shown in FIG. 3. It is therefore possible to achieve a cost reduction.

Thus, the bidirectional signal control circuit according to the present embodiment can be activated at high speed while it is simple in circuit configuration. Even when delays due to load capacity and resistance, which result from a wiring length, increase with a further advance in scale down of a semiconductor integrated circuit, the bidirectional signal control circuit is suitable for application to various semiconductor integrated circuits.

In the above-described embodiment, the signal wire is divided into the five wiring parts or sections. The central wiring section 33 is determined as the intermediate wiring section. While the control signal line can be minimized in length if done in this way, the wiring sections other than the central wiring section may be determined as [intermediate wiring sections] respectively. Even in this case, the control signal line can be shortened as compared with the conventional one.

In the above-described embodiment, other wiring sections 32 and 34 respectively exist between the wiring sections 31 and 35 provided at both ends of the wire and the intermediate wiring section 33. However, there may also be cases where such wiring sections do not exist, and at least one of the wiring sections 31 and 35 at both ends of the wire and the intermediate wiring section 33 adjoin each other.

In the bidirectional signal control circuit according to the present invention as described above, bidirectional buffers are respectively configured so as to be directionally controlled based on control signals for controlling tri state drivers electrically connected to wiring sections placed on the sides closer to the ends on the wire, of the bidirectional buffers. Therefore, the wire used for the control signals supplied to the bidirectional buffers can be shortened and the bidirectional signal control circuit can be speeded up in a simple configuration.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A bidirectional signal control circuit, comprising:

a plurality of conductive sub line segments for transferring bi-directional signals, said sub line segments being grouped into a first group, a second group, and an intermediate sub line segment placed between the first group and the second group, said first group including one or a plurality of sub line segments close to one another and said second group including the remaining sub line segments except for the intermediate sub line segment;

a plurality of drivers respectively connected to corresponding ones of the sub line segments and for respectively transferring data signals to the sub line segments in response to one of a plurality of control signals; and a plurality of bidirectional buffers respectively placed between the sub line segments, the bidirectional buffers that are connected to the sub line segments included in the first group being respectively controlled so as to transfer signals in the direction of the intermediate sub line segment when data signals are respectively transferred to the sub line segments included in the first group through said drivers, and the bidirectional buffers that are connected to the sub line segments included in the second group being respectively controlled so as to transfer signals in the direction of the intermediate sub line segment when data signals are respectively transferred to the sub line segments included in the second group through said drivers.

2. The bidirectional signal control circuit as claimed in claim 1, wherein when a data signal is transferred to a sub line segment included in the first group through the corresponding driver, one bidirectional buffer of said plurality of bidirectional buffers, which is connected to the sub line segment included in the second group, is controlled so as to transfer a signal in the direction opposite to the direction of the intermediate sub line segment, and when a data signal is transferred to a sub line segment included in the second group through the corresponding driver, one bidirectional buffer of said plurality of bidirectional buffers, which is connected to the sub line segment included in the first group, is controlled so as to transfer a signal in the direction opposite to the direction of the intermediate sub line segments.

3. The bidirectional signal control circuit as claimed in claim 1, wherein the direction of transfer of a signal by each bidirectional buffer connected to a sub line segment included in the first group is controlled based on at least a control signal inputted to the corresponding driver connected to the sub line segment included in the first group, and the direction of transfer of a signal by each bidirectional buffer connected to the sub line segment included in the second group is controlled based on at least a control signal inputted to the corresponding driver connected to the sub line segment included in the second group.

4. The bidirectional signal control circuit as claimed in claim 2, wherein the direction of transfer of a signal by each bidirectional buffer connected to the sub line segment included in the first group is controlled based on at least a control signal inputted to the corresponding driver connected to the sub line segment included in the first group, and the direction of transfer of a signal by each bidirectional buffer connected to the sub line segment included in the second group is controlled based on at least a control signal inputted to the corresponding driver connected to the sub line segment included in the second group.

5. The bidirectional signal control circuit as claimed in claim 3, wherein said control signals respectively selectively have a first voltage level or a second voltage level, each driver outputs a signal corresponding to the data signal to the corresponding sub line segment when the voltage level of the corresponding control signal is the first voltage level, and any of the control signals inputted to the drivers connected to the sub line segments included in the second group is brought to the second voltage level when any one of the control signals inputted to the drivers connected to the sub line segments included in the first group is of the first voltage level.

6. The bidirectional signal control circuit as claimed in claim 4, wherein said control signals respectively selectively have a first voltage level or a second voltage level, each driver outputs a signal corresponding to the data signal to the corresponding sub line segment when the voltage level of the corresponding control signal is the first voltage level, and any of the control signals inputted to the drivers connected to the sub line segments included in the second group is brought to the second voltage level when any one of the control signals inputted to the drivers connected to the sub line segments included in the first group is of the first voltage level.

7. A bidirectional signaling circuit, comprising:

first, second, and third conductor segments, the third conductor segment being disposed between the first and second conductor segments;

a first tri-state driver having a data signal input terminal, a control signal input terminal, and an output terminal, the output terminal being coupled to the first conductor segment;

a first bidirectional buffer having a data signal terminal that is coupled to the first conductor segment and having another data signal terminal that is coupled to the third conductor segment, the first bidirectional buffer also having a complimentary pair of control signal input terminals;

first means, coupled to the control signal input terminal of the first tri-state driver, for supplying a first control signal to both of the complimentary pair of control signal input terminals of the first bidirectional buffer;

a second tri-state driver having a data signal input terminal, a control signal input terminal, and an output terminal, the output terminal of the second tri-state buffer being coupled to the second conductor segment;

a second bidirectional buffer having a data signal terminal that is coupled to the second conductor segment and having another data signal terminal that is coupled to the third conductor segment, the second bidirectional buffer also having a complimentary pair of control signal input terminals; and second means, coupled to the control signal input terminal of the second tri-state driver, for supplying a second control signal to both of the complimentary pair of control signal input terminals of the second bidirectional buffer, wherein the first bidirectional buffer transfers data signals from the first conductor segment to the third conductor segment when the first control signal is in a first digital state and transfers data signals from the third conductor segment to the first conductor segment when the first control signal is in a second digital state, and wherein the second bidirectional buffer transfers data signals from the second conductor segment to the third conductor segment when the second control signal is in the first digital state and transfers data signals from the third conductor segment to the second conductor segment when the second control signal is in the second digital state.

8. The bidirectional signaling circuit of claim 7, further comprising another tri-state driver having a data signal input terminal, a control signal input terminal, and an output terminal, the output terminal of the another tri-state driver being coupled to the third conductor segment.

9. The bidirectional signaling circuit of claim 7, further comprising:

a further conductor segment;

a further tri-state driver having a data signal input terminal, a control signal input terminal, and an output terminal, the output terminal of the further tri-state driver being coupled to the further conductor segment;

a further bidirectional buffer having a data signal terminal that is coupled to the further conductor segment and having another data signal terminal that is coupled to the first conductor segment, the further bidirectional buffer also having a complimentary pair of control signal input terminals, and further means, coupled to the control signal input terminal of the further tri-state driver, for supplying a further control signal to both of the complimentary pair of control signal input terminals of the further bidirectional buffer, wherein the further bidirectional buffer transfers data signals from the further conductor segment to the first conductor segment when the further control signal is in the first digital state and transfers data signals from the first conductor segment to the further conductor segment when the further control signal is in the second digital state, and wherein the first means is additionally coupled to the further means.

10. The bidirectional signaling circuit of claim 9, wherein the first means comprises means for OR-ing the further control signal with a control signal applied to the control signal input terminal of the first tri-state driver to generate the first control signal.

11. The bidirectional signaling circuit of claim 9, further comprising:

an additional conductor segment; an additional tri-state driver having a data signal input terminal, a control signal input terminal, and an output terminal, the output terminal of the additional tri-state driver being coupled to the additional conductor segment;

an additional bidirectional buffer having a data signal terminal that is coupled to the additional conductor segment and having another data signal terminal that is coupled to the second conductor segment, the additional bidirectional buffer also having a complimentary pair of control signal input terminals, and additional means, coupled to the control signal input terminal of the additional tri-state driver, for supplying an additional control signal to both of the complimentary pair of control signal input terminals of the additional bidirectional buffer, wherein the additional bidirectional buffer transfers data signals from the additional conductor segment to the second conductor segment when the additional control signal is in the first digital state and transfers data signals from the second conductor segment to the additional conductor segment when the additional control signal is in the second digital state, and wherein the second means is additionally coupled to the additional means.

12. The bidirectional signaling circuit of claim 11, wherein the second means comprises means for OR-ing the additional control signal with a control signal applied to the control signal input terminal of the second tri-state driver to generate the second control signal.

* * * * *